United States Patent
Li et al.

(10) Patent No.: US 10,879,093 B2
(45) Date of Patent: *Dec. 29, 2020

(54) SYSTEM FOR A SEMICONDUCTOR FABRICATION FACILITY AND METHOD FOR OPERATING THE SAME

(71) Applicant: TAIWAN SEMICONDUCTOR MANUFACTURING COMPANY LTD., Hsinchu (TW)

(72) Inventors: Fu-Hsien Li, Taichung (TW); Sheng-Kang Yu, Hsinchu (TW); Chi-Feng Tung, Miaoli County (TW); Hsiang Yin Shen, Hsinchu (TW); Guancyun Li, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/703,518

(22) Filed: Dec. 4, 2019

(65) Prior Publication Data
US 2020/0105556 A1   Apr. 2, 2020

Related U.S. Application Data

(63) Continuation of application No. 15/636,157, filed on Jun. 28, 2017, now Pat. No. 10,504,760.

(51) Int. Cl.
*H01L 21/67* (2006.01)
*B66C 17/26* (2006.01)
(Continued)

(52) U.S. Cl.
CPC ........ *H01L 21/67265* (2013.01); *B66C 13/16* (2013.01); *B66C 13/18* (2013.01);
(Continued)

(58) Field of Classification Search
CPC ......... H01L 21/67265; H01L 21/67706; H01L 21/67259; H01L 21/67733;
(Continued)

(56) References Cited

U.S. PATENT DOCUMENTS

2002/0197136 A1* 12/2002 Huang .............. H01L 21/67775
414/217
2004/0118980 A1* 6/2004 Chang ............... H01L 21/67736
246/1 C
(Continued)

*Primary Examiner* — Jigneshkumar C Patel
(74) *Attorney, Agent, or Firm* — WPAT, P.C., Intellectual Property Attorneys; Anthony King

(57) ABSTRACT

A system for a semiconductor fabrication facility includes a manufacturing tool including a load port, a maintenance tool including a first track and at least one maintenance crane on the first track, a rectangular zone overlapping with the load port, a plurality of first sensors on the first track and at corners of the rectangular zone configured to detect a location of the maintenance crane and generate a first location date, a transporting tool including a second track and a OHT vehicle on the second track, at least a second sensor on the OHT vehicle and configured to generate a second location data, at least a third sensor on the load port, and a control unit configured to receive the first location data and the second location data, and send signals to the second sensor and the third sensor or to cut off the signal to the second sensor.

16 Claims, 7 Drawing Sheets

(51) Int. Cl.
  *B66C 15/00* (2006.01)
  *B66C 13/16* (2006.01)
  *B66C 13/18* (2006.01)
  *G05B 19/19* (2006.01)
  *G05B 19/4061* (2006.01)
  *H01L 21/677* (2006.01)
  *G03F 7/20* (2006.01)

(52) U.S. Cl.
  CPC .............. *B66C 15/00* (2013.01); *B66C 17/26* (2013.01); *G03F 7/70033* (2013.01); *G03F 7/7075* (2013.01); *G03F 7/7085* (2013.01); *G03F 7/70533* (2013.01); *G03F 7/70741* (2013.01); *G03F 7/70975* (2013.01); *G03F 7/70991* (2013.01); *G05B 19/19* (2013.01); *G05B 19/4061* (2013.01); *H01L 21/67259* (2013.01); *H01L 21/67706* (2013.01); *H01L 21/67721* (2013.01); *H01L 21/67724* (2013.01); *H01L 21/67733* (2013.01); *H01L 21/67736* (2013.01); *G05B 2219/40292* (2013.01); *G05B 2219/45031* (2013.01)

(58) Field of Classification Search
  CPC ......... H01L 21/67724; H01L 21/67721; H01L 21/67736; H01L 21/67276; G03F 7/70533; G03F 7/70991; G03F 7/7075; G03F 7/70741; G03F 7/7085; G03F 7/70975; G03F 7/70033; B66C 17/26; B66C 15/00; B66C 13/16; B66C 13/18; G05B 19/19; G05B 19/4061; G05B 2219/45031; G05B 2219/40292
  USPC ........................................................ 700/113
  See application file for complete search history.

(56) References Cited

U.S. PATENT DOCUMENTS

2005/0079041 A1* 4/2005 Campbell ......... H01L 21/67775
  414/626
2009/0044747 A1* 2/2009 Nishimura ........ H01L 21/67253
  118/695
2015/0049322 A1* 2/2015 Park .................. H01L 21/67276
  355/72

* cited by examiner

SYSTEM FOR A SEMICONDUCTOR FABRICATION FACILITY AND METHOD FOR OPERATING THE SAME

PRIORITY CLAIM AND CROSS-REFERENCE

This application is a continuation of U.S. patent application Ser. No. 15/636,157, filed on Jun. 28, 2017, entitled of "SYSTEM FOR A SEMICONDUCTOR FABRICATION FACILITY AND METHOD FOR OPERATING THE SAME", the disclosure of which is hereby incorporated by reference in its entirety.

BACKGROUND

Integrated circuits are typically manufactured in automated or semi-automated facilities, by passing substrates/wafers in and on which the devices are fabricated through a large number of manufacturing steps to complete the devices. The number and the type of manufacturing steps a semiconductor device has to go through may depend on the specifics of the semiconductor device to be fabricated. For instance, a sophisticated chip may require several hundred manufacturing steps.

Furthermore, modern semiconductor fabrication facilities ("FABS") employ systems to transport workpieces such as substrates/wafers and reticles to the tools required in the process flow. Therefore reticle transporting devices and wafer transporting devices have been adopted in semiconductor manufacturing tools/apparatuses used in manufacturing processes, such as the semiconductor exposure apparatuses used in a photolithography process. A system that is able to safely and efficiently transfer the workpieces in order to improve the throughput and output rate is thus necessary.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
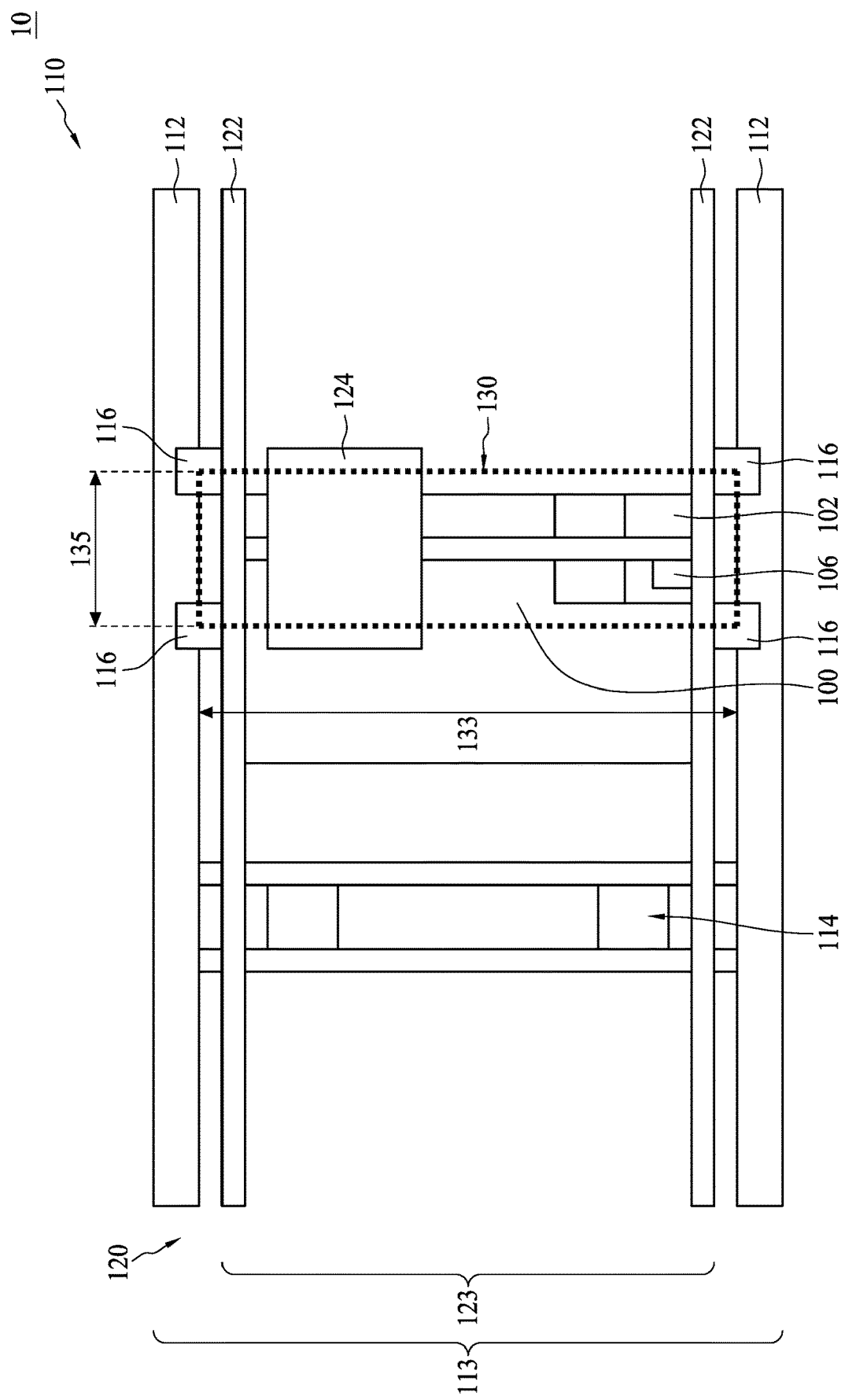
FIG. 1A is a top view of an exemplary apparatus for a semiconductor fabrication facility, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

During production, customized parts such as reticles or wafers usually are transported from their storage place to manufacturing apparatus/tools and back again by a transporting device in a specific, standardized carrier. When the transporting device is located on and aligned to the manufacturing tool, the carrier is lowered to a load port of the manufacturing tool to load or unload the customized parts. Besides the transporting device, a maintenance device is also required in a semiconductor FAB, such that the manufacturing tool(s) can be repaired or maintained in time.

The transporting device and the maintenance device, which are independent to each other, may be installed in a FAB independently. For example, the maintenance tool is suspended from a ceiling of a FAB, and the transporting device is suspended over the maintenance tool. More important, the transporting device and the maintenance device are operated independently. It is found such independent operations for the transporting device and the maintenance device may cause serious problem: When the transporting device is loading or unloading the customized parts to or from the load port, it may hit the maintenance device in a case that the maintenance device is also moved to above the load port, therefore damages the transporting device. The damaged transporting device needs to be repaired or replaced, and the repair or replacement causes unwanted high cost and considerable down time for the semiconductor FAB.

Present disclosure provides an apparatus and a system for a semiconductor fabrication facility that monitor the locations of the maintenance device and the transporting device to prevent potential collision of the two independent devices.

Figure 1B:
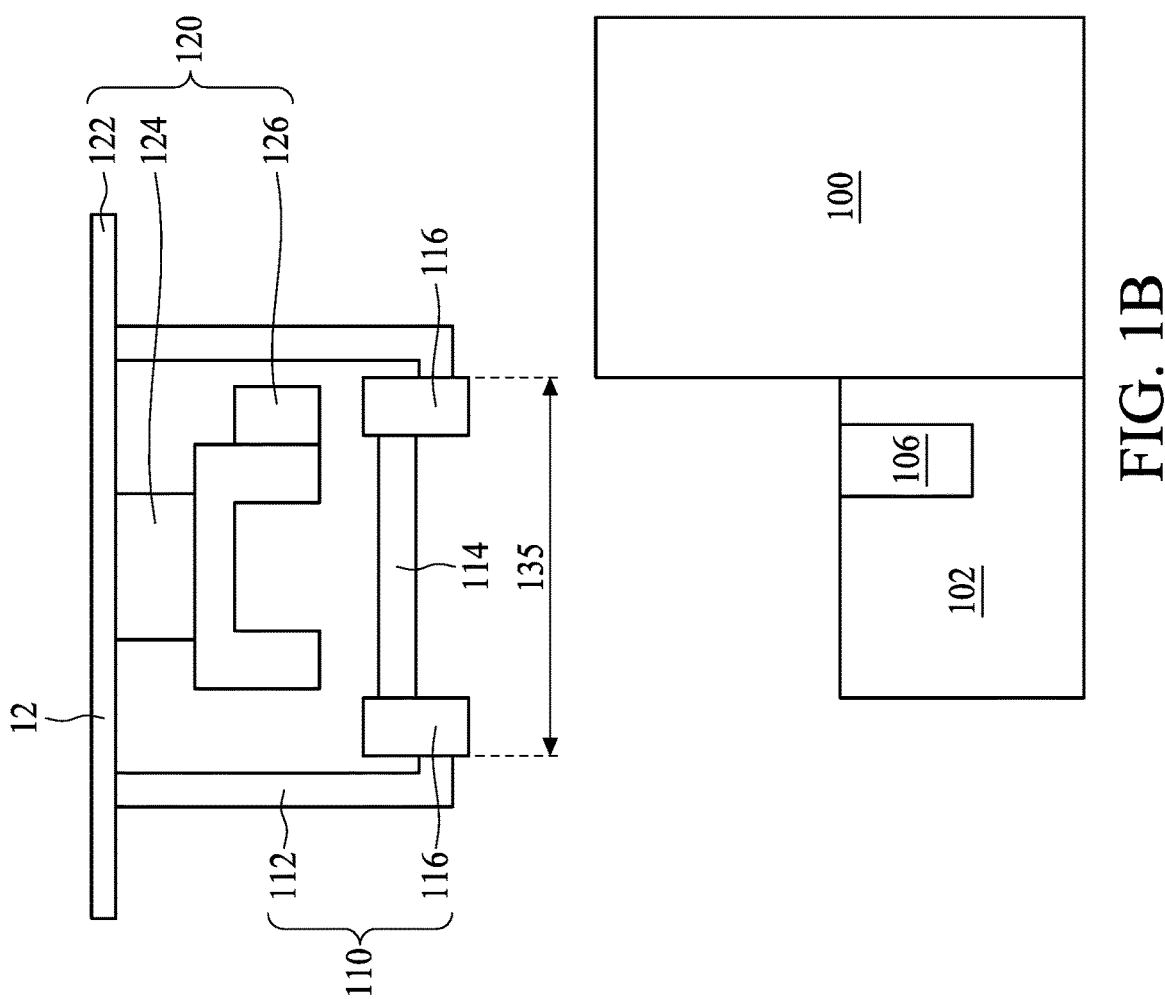
FIG. 1B is a side view of the system for the semiconductor fabrication facility, in accordance with some embodiments of the present disclosure.
Figure 2:
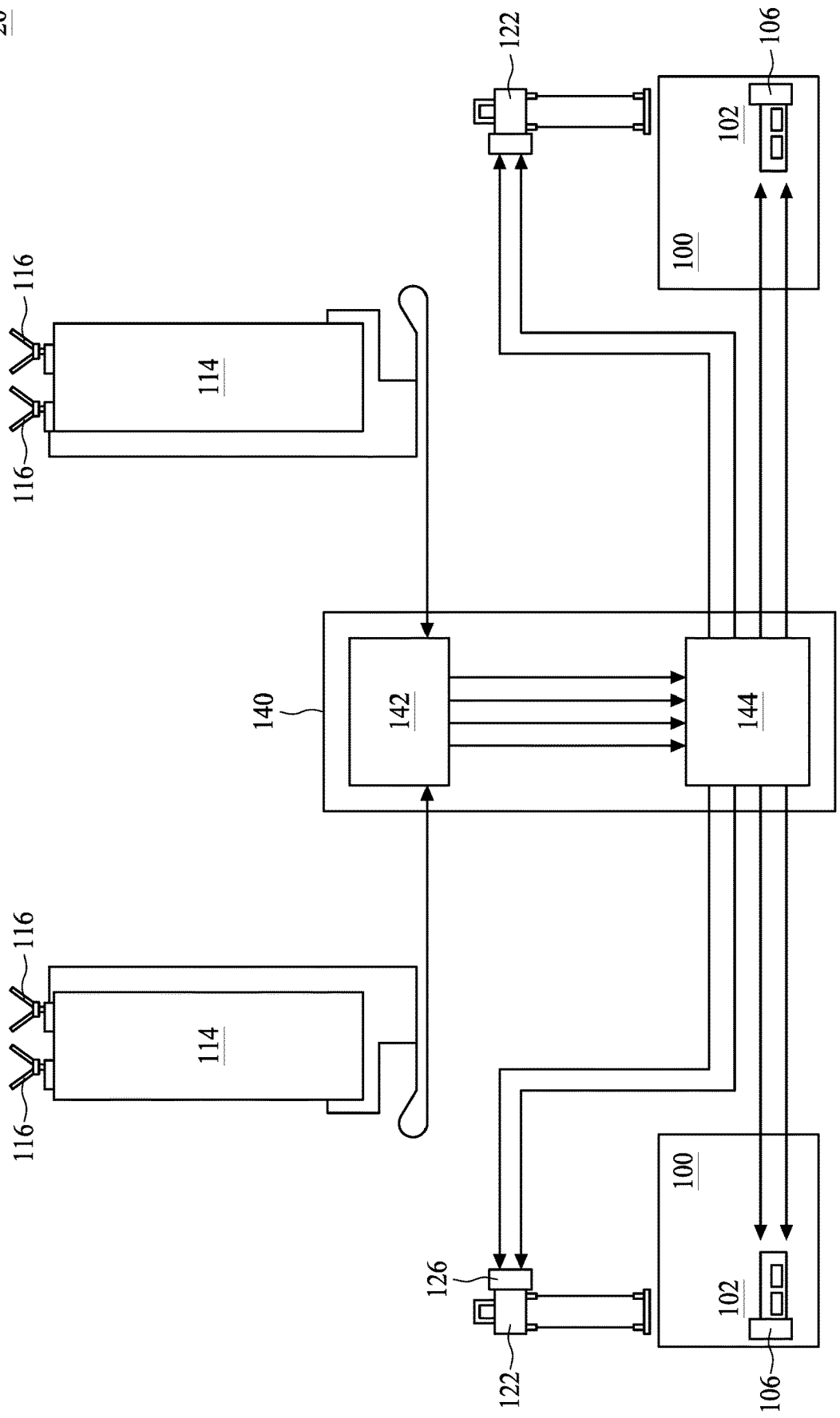
FIG. 2 is a block diagram of the system for semiconductor fabrication facility, in accordance with some embodiments of the present disclosure.

FIG. 1A is a top view of an exemplary apparatus 10 for a semiconductor fabrication facility illustrated with an underlying manufacturing tool 100, FIG. 1B is a side view of a system 20 for the semiconductor fabrication facility, and FIG. 2 is an embodiment of a block diagram of the system 20 for the semiconductor fabrication facility. Referring to FIG. 1A and FIG. 1B, the apparatus 10 includes a maintenance tool 110 and a transporting tool 120. The maintenance tool 110 includes a first track 112 at a first horizontal plane 113, at least one maintenance crane 114 movably mounted on the first track 112, and a plurality of first sensors 116 on the first track 112. The transporting tool 120 includes a second track 122 at a second horizontal plane 123 different from the first horizontal plane 113, at least one overhead hoisting transporting (OHT) vehicle 124 movably mounted on the second track 122, and at least one second sensor 126 on the OHT vehicle 124. As shown in FIG. 1A, the first horizontal plane 113 and the second horizontal plane 123 partially overlap each other from a plane view. In some embodiments of the present disclosure, the apparatus 10 can be integrated in a system 20, as shown in FIG. 1B and FIG. 2, for a semiconductor fabrication facility, and the apparatus 10 integrated in the system 20 will be further described according to one or more embodiments in the following description.

In some embodiments, the system 20 can be an automated material handling system (AMHS) automatically handling and transporting customized part such as wafer(s) or reticle(s) to manufacturing tools. The AMHS in a semiconductor FAB includes numerous types of automated and manual vehicles for moving and transporting the reticle carriers and/or wafer carriers throughout the FAB during the manufacturing process. This can include for example, without limitation, automatic guided vehicles (AGVs), personal guided vehicles (PGVs), rail guided vehicles (RGVs), overhead shuttles (OHSs), and overhead hoist transports (OHTs).

As shown in FIG. 1A, FIG. 1B, and FIG. 2, the system 20 includes at least a manufacturing tool 100 and the apparatus 10 over the manufacturing tool 100. The apparatus 10 includes the maintenance tool 110 over the manufacturing tool 100 and the transporting tool 120 over the maintenance tool 110. The manufacturing tool 100 can be any type of wafer handling, fabrication, testing, metrology, or other equipment commonly used in a semiconductor FAB. In some embodiments of the present disclosure, the manufacturing tool 100 can be, for example but not limited to, a photolithography tool such as an extreme ultraviolet (EUV) lithography tool. The manufacturing tool 100 includes at least a load port 102 for inserting or removing a customized part into or from the manufacturing tool 100. In some embodiments of the present disclosure, the load port 102 may include separate loading unit and unloading unit.

The maintenance tool 110 of the apparatus 10 integrated in the system 20 includes the first track (including rails) 112 and the maintenance crane 114. The first track 112 is affixed and suspended from ceiling 12 of the FAB, and the maintenance crane 114 is movably mounted on the first track 112 for maintaining and repairing the manufacturing tool 100.

The transporting tool 120 of the apparatus 10 integrated in the system 20 is configured to transport at least one customized part such as a wafer or a reticle. For example, the transporting tool 120 transports at least a reticle when the manufacturing tool 100 is a photolithography tool. The transporting tool 120 includes the second track 122 (including rails) and the OHT vehicle 124. The second track 122 is affixed and suspended from the ceiling 12 of the FAB over the first track 112. The OHT vehicle 124 is movably mounted on the second track 122, and operable to transport the customized part such as the reticle in a carrier through the FAB. As shown in FIG. 1A, the OHT vehicle 124 is configured to complement and cooperate with the second track 122 for rolling laterally or horizontally along the second track 122 and transporting the carrier from one location to another. The OHT vehicle 124 over the first track 112 is hung up and spaced apart from the first track 112 and the maintenance crane 114 when horizontally moving along the second track 122. Furthermore, the OHT vehicle 124 is configured and operable to vertically pickup, raise/lower, articulate, and release the carrier to and from the manufacturing tool 100.

Referring to FIG. 1A, FIG. 1B and FIG. 2 again. The apparatus 10 integrated in the system 20 includes the first sensors 116 on the first track 112 of the maintenance tool 110. Specifically, the first sensors 116 are disposed correspondingly to the load port 102 of the manufacturing tool 100. In some embodiments of the present disclosure, four first sensors 116 are disposed on the first track 112 and one rectangular zone overlapping the entire load port 102 is thereby defined as shown in FIG. 1A. This rectangular zone is referred to as a "danger zone" 130 because unwanted incident such as collision between two devices/tools may occur in the zone. The distance between the two first sensors 116 on the same rail of the first track 112 defines a width 135 of the danger zone 130, and the distance between the two first sensors 116 on different rails of the first track 112 defines a length 133 of the danger zone 130. Accordingly, the length 133 of the danger zone 130 substantially equals to the distance between the two rails of the first track 112. More importantly, the width 135 of the danger zone 130 is made larger than a width of the load port 102, or even larger than a width of the maintenance crane 114. As shown in FIG. 1A, the width of the load port 102 and the width of the maintenance crane 114 are measured parallel with the first track 112. Moreover, the first sensors 116 are configured to detect a location of the maintenance crane 114. In some embodiments of the present disclosure, the first sensors 116 may include limit switch or similar mechanically actuated device, but not limited thereto.

As shown in FIGS. 1B and 2. The apparatus 10 integrated in the system 20 includes the second sensor 126 disposed on the OHT vehicle 124 of the transporting tool 120. And the system 20 includes a third sensor 106 disposed on the load port 102 of the manufacturing tool 100. The second sensor 126 and the third sensor 106 can be a parallel transceiver such as E84 optical communication sensors, but not limited to this. It is appreciated that the second sensor 126 and the third sensor 106 may be any suitable sensors performing communications therebetween.

Referring to FIG. 2. The system for semiconductor fabrication facility 20 further includes a control unit 140 configured to control the maintenance tool 110 and the transporting tool 120 of the apparatus 10. The control unit 140 includes a data collector 142 and an interface panel 144.

The data collector 142 is configured to collect and store data from the first sensors 116. For example, the first sensors 116 detect the location of the maintenance crane 114 on the first track 112 and send data about the location to the data collector 142. The interface panel 144 is configured to receive the data from the data collector 142, and to send signals to the second sensor 126 and the third sensor 106 or to cut off the signal to the second sensor 126. In some embodiments of the present disclosure, the system 20 may include more than one manufacturing tool 100, more than one maintenance crane 114, and more than one OHT vehicle 124 as shown in FIG. 2. Accordingly, the control unit 140 can control the maintenance crane 114 and the OHT vehicle individually according to the data received from those sensors 116/126, and those details will be further described according to one or more embodiments in the following description.

Figure 3:
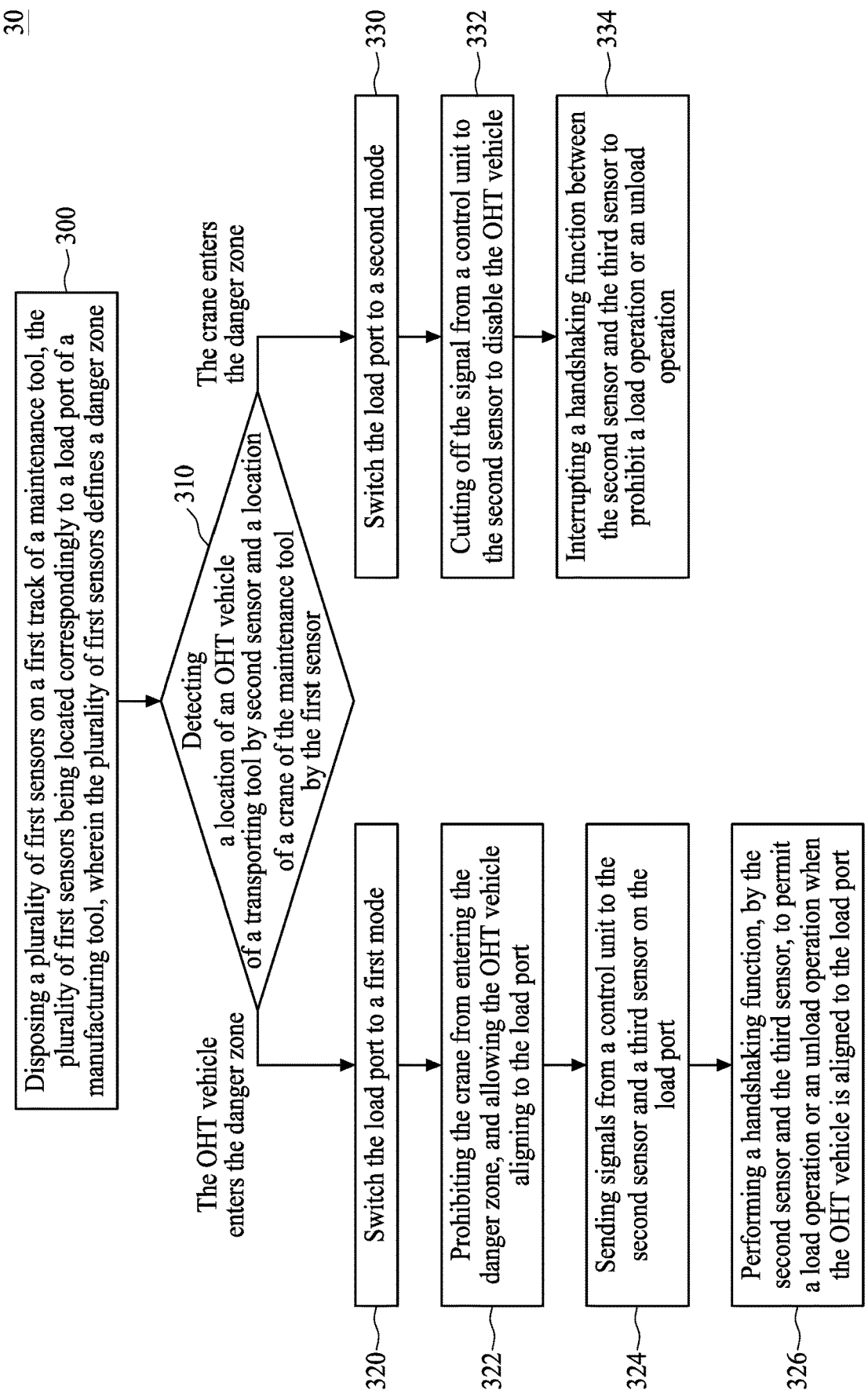
FIG. 3 is a flow chart representing a method for operating the system for the semiconductor fabrication facility, in accordance with some embodiments of the present disclosure.
Figure 4:
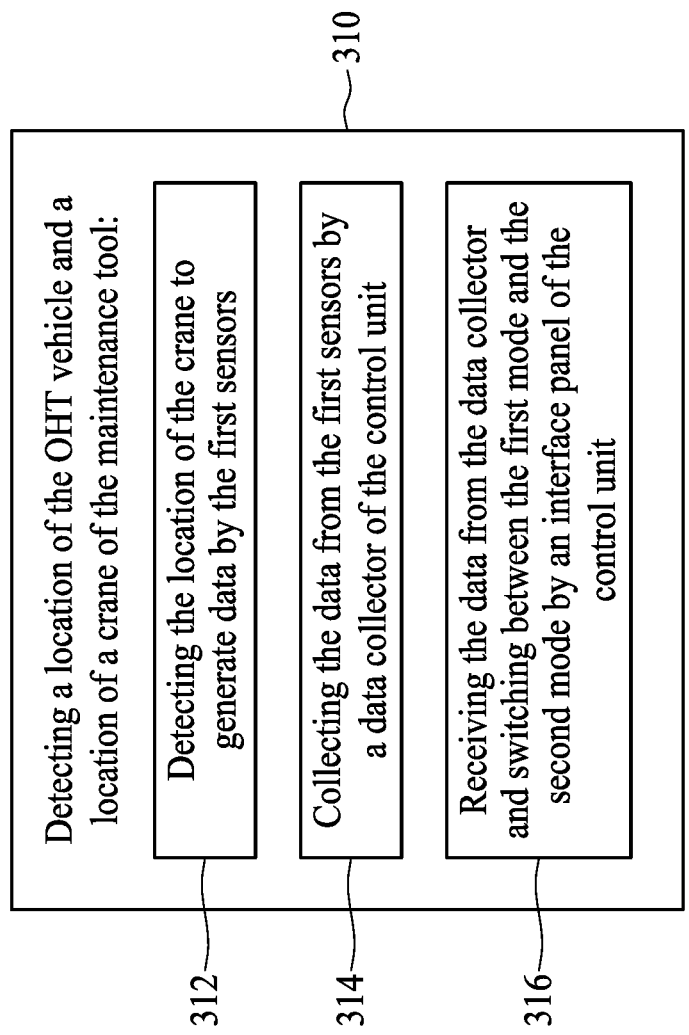
FIG. 4 is a flow chart representing exemplary operations of the method for operating the system for the semiconductor fabrication facility, in accordance with some embodiments of the present disclosure.

Referring to FIGS. 3-4 and with additional reference to FIG. 1A, FIG. 1B, and FIG. 2, an exemplary method 30 illustrates one possible flow through the system 20 of FIG. 2.

In Operation 300, the first sensors 116 are disposed on the first track 112. The plurality of first sensors 116 are located correspondingly to the load port 102 of the manufacturing tool 100, thus the plurality of first sensors 116 defines a danger zone 130. As mentioned above, the first sensors 116 are disposed on the first track 112 and the rectangular danger zone 130 overlapping the entire load port 102 is thereby defined as shown in FIG. 1A.

In Operation 310, location of the maintenance crane 114 is detected by the first sensors 112 and location of the OHT vehicle 124 is detected by the second sensor 126. In some embodiments of the present disclosure, Operation 310 may further include Operations 312-316 as shown in FIG. 4. In Operation 312, the location of the maintenance crane 114 is detected by the first sensors 116 disposed on the first track 112. Referring to FIG. 1A again, the maintenance crane 114 may be located in a waiting area and may enter the working area in the semiconductor FAB if required. Therefore the first sensors 116 are to detect the location of the maintenance crane 114 and generate data about the location of the maintenance crane 114.

In Operation 314, the data is then collected and stored in the data collector 142 of the control unit 140 through an Ethernet network or other compatible network system. In Operation 316, the collected data are then transferred to the interface panel 144 of the control unit 140. By receiving the data about the locations of the maintenance crane 114, and by detecting the location of the OHT vehicle 124, the interface panel 144 is triggered to switch the load port 102 between two modes: a first mode such as an automatic mode and a second mode such as a manual mode.

Referring back to FIG. 3, in Operation 320, when the OHT vehicle 124 enters the danger zone 130, the interface panel 144 switches the load port 102 to the first mode, then Operation 322 to Operation 326 are sequentially operated. In Operation 322, the maintenance crane 114 is prohibited from entering the danger zone 130 while the OHT vehicle 124 in the danger zone 130 is allowed aligning to the load port 102. In Operation 324, signals are sent from the interface panel 144 of the control unit 140 to both of the second sensor 126 on the OHT vehicle 124 and the third sensor 106 on the load port 102 of the manufacturing tool 100. In some embodiments of the present disclosure, Operation 322 and Operation 324 may be operated simultaneously.

In Operation 326, a handshaking function is performed by the second sensor 126 and the third sensor 106 to permit a load operation or an unload operation when the OHT vehicle 124 aligns to the load port 102. In other words, when the second sensor 126 and the third sensor 106 receive the signal from the interface panel 144 of the control unit 140, the second sensor 126 and the third sensor 106 communicate and perform the handshaking function, and alignment between the OHT vehicle 124 and the load port 102 is confirmed, then the load operation or the unload operation, which are to vertically lower and release the reticle carrier to the manufacturing tool 100 or to pickup and raise the reticle carrier from the manufacturing tool 100, is permitted.

On the other hand, in Operation 330, when the maintenance crane 114 enters the working area, especially enters the danger zone 130, the interface panel 144 switches the load port 102 to the second mode, and then Operation 332 to Operation 334 are sequentially operated.

In Operation 332, signal sent from the control unit 140 to the second sensor 126 on the OHT vehicle 124 is cut off to disable the OHT vehicle 124. In Operation 334, since the signal to the OHT vehicles 124 is cut off, the handshaking function between the second sensor 126 and the third sensor 106 is interrupted, thus the load operation or the unload operation is prohibited. In some embodiments of the present disclosure, operations or movements of the OHT vehicle 124 is prohibited such that the OHT vehicle 124 will not hit the maintenance crane 114 entering the danger zone 130. Accordingly, damages to the OHT vehicle 124 due to the impact/hit are avoided. In some embodiments of the present disclosure, interruption to the handshaking function between the second sensor 126 and the third sensor 106 can be achieved by cutting off the signal sent from the control unit 140 to the third sensor 106 on the load port 102. In those embodiments, the OHT vehicle 124 can be disabled and the load/unload operations are prohibited after the handshaking function is interrupted.

In some embodiments of the present disclosure, the second mode is a manual mode. And in the manual mode, the OHT vehicle 124 can be operated manually until the maintenance crane 114 leaves the danger zone 130 or moves back the waiting area.

Figure 5A:
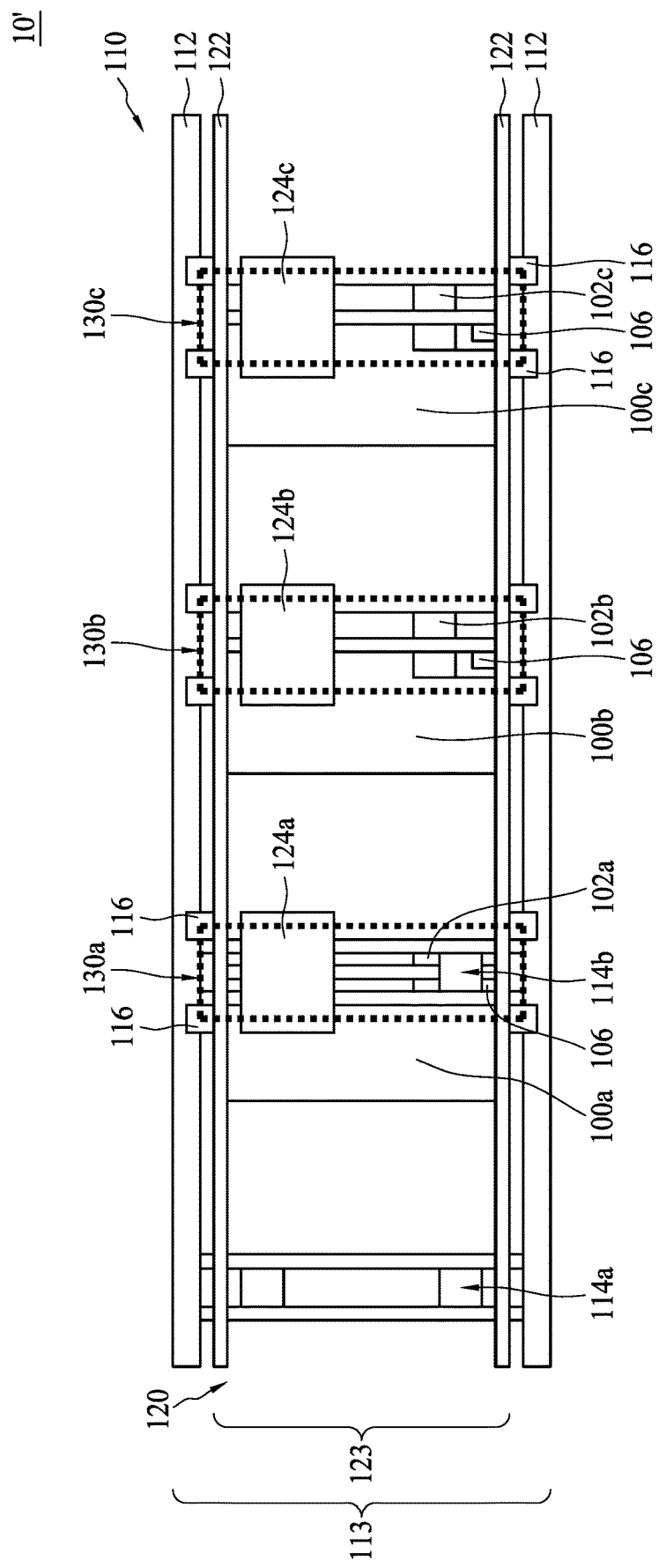
FIG. 5A is a top view of an apparatus for the semiconductor fabrication facility, in accordance with some embodiments of the present disclosure.
Figure 5B:
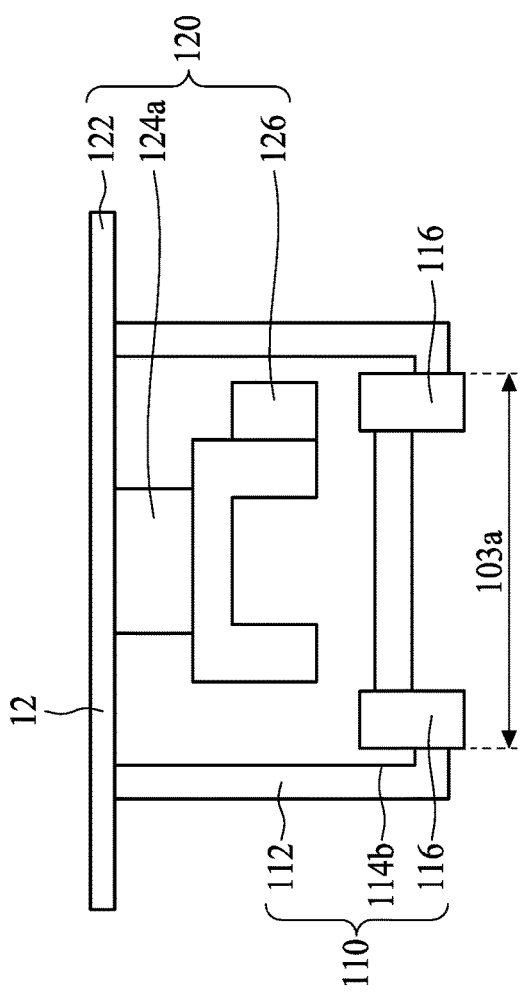
FIG. 5B is a side view of the system for the semiconductor fabrication facility, in accordance with some embodiments of the present disclosure.
Figure 5B:
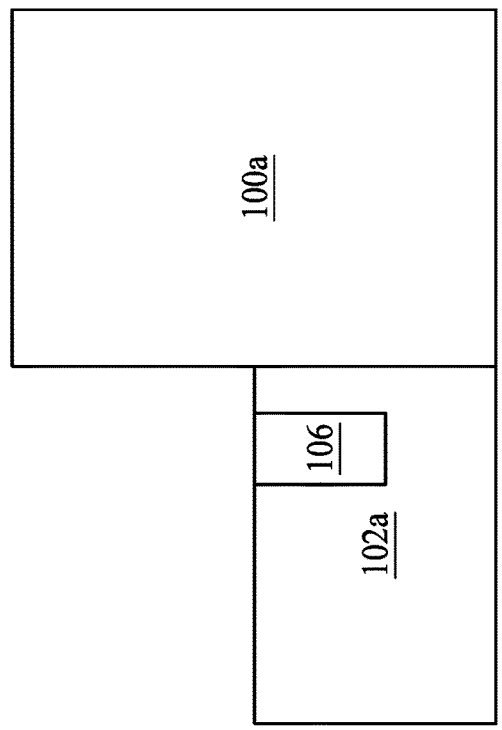

FIG. 5A is a top view of an apparatus 10' illustrated with an underlying manufacturing tool 100a, 100b, and 100c in accordance with some embodiments of the present disclosure, and FIG. 5B is a side view of a portion of the system for the semiconductor fabrication facility 20' and the apparatus 10' in accordance with some embodiments of the present disclosure. In some embodiments of the present disclosure, the system for the semiconductor fabrication facilities 20' includes a plurality of manufacturing tools 100a, 100b, and 100c for one manufacturing operation or different manufacturing operations as shown in FIGS. 5A-5B, and the transporting tool 120 of the apparatus 10' integrated in the system 20' may include a plurality of OHT vehicles 124a, 124b, and 124c using second tracks 122 or rails operable to guide the movement. It is appreciated that the method 30 of FIGS. 3-4 can be applied to the system for the semiconductor fabrication facility 20' of FIGS. 5A-5B. For example, in Operation 300, several first sensors 116 are disposed on the first track 112 to define a plurality of danger zones 130a, 130b, and 130c, and each of the danger zones 130a, 130b, and 130c is defined correspondingly to load ports 102a-102c of the manufacturing tools 100a-100c, respectively. In Operation 310, locations of the OHT vehicles 124a-124c are respectively detected by the second sensors 126, and locations of the maintenance cranes 114a and 114b are respectively detected by the first sensors 106. Thus, the interface panel 144 of the control unit 140 switches the load port 102a-102c between the first mode and the second mode individually according to the location detection result of the OHT vehicles 124a-124c and the maintenance cranes 114a-114b.

For example in some embodiments of the present disclosure, when the OHT vehicle 124c enters the danger zone 130c while the OHT vehicles 124a and 124b are out of the danger zones 130a and 130b, the interface panel 144 of the control unit 140 switches the load port 102c to the first mode or the automatic mode as in Operation 320. Accordingly, the maintenance cranes 114a and 114b are prohibited from entering the danger zone 130c, for example, maintenance cranes 114a and 114b can no longer be automatically controlled. In some embodiments, the maintenance cranes 114a and 114b are switched to manual control once the load port 102c is in the automatic mode. However, the maintenance cranes 114a and 114b can be manually controlled to enter the danger zones 130a and 130b without any OHT vehicle occupying, if required.

On the other hand, when the maintenance crane 114b enters, for example, the danger zone 130a, the interface panel 144 switches the load port 102a to the second mode as in Operation 330. In some embodiments of the present disclosure, the OHT vehicle 124a is not in the danger zone 130a when the maintenance crane 114b entering the danger zone 130a because the maintenance crane 114b would have been prohibited from approaching danger zone 130a if the second sensor 126a identifies the OHT vehicle 124a was already in the danger zone 130a.

In some embodiments of the present disclosure, when the OHT vehicle 124a is already in the danger zone 130a and the maintenance crane 114b mistakenly and accidentally enters the danger zone 130a as shown in FIGS. 5A and 5B, the interface panel 144 switches the load port 102a to the second mode according to the location detection result. Thus, the OHT vehicle 124a in the danger zone 130a is disabled by cutting off the signal from the control unit 140 to the second sensor 126 on the OHT vehicle 124a. Consequently, the handshaking function between the second sensor 126 on the OHT vehicle 124a and the third sensor 106 on the load port 102a is interrupted, and the load or unload operation is prohibited. In some embodiments, since the second mode for the load port 102a is a manual mode, the disabled OHT vehicle 124a cannot automatically controlled and is remained at its position at the time the load port 102a being switched to the manual mode as shown in FIG. 5B. Since the load operation or the unload operation is prohibited, impact between the OHT vehicle 124a and the maintenance crane 114b is avoided. Away from the danger zone 130a, if the OHT vehicles 124b and 124c are in the danger zones 130b and 130c, the load port 102b and 102c are still in the first mode, and the maintenance cranes 114a and 114b are still prohibited from entering the danger zone 130b and 130c. In other words, if the OHT vehicles 124b and 124c are not in the danger zones 130b and 130c, the maintenance cranes 114a and 114b are free to enter danger zones 130b and 130c.

It will be appreciated that in the forgoing method, the maintenance crane is prohibited entering the danger zone when the OHT vehicle is in the danger zone, therefore hit or impact between the OHT vehicle in operation and the maintenance crane is avoided. And when the maintenance crane enters the danger zone, the OHT vehicles are disabled and no load/unload operation is permitted, therefore hit or impact between the OHT vehicle and the maintenance crane in operation is also avoided.

It will be further appreciated that the foregoing apparatus and system may be used in the automated material handling system (AMHS) for semiconductor fabrication facilities. Accordingly, the manufacturing tool is not limited to the EUV photolithography along, and the OHT vehicle is not limited to transport the reticle(s) along, either. The OHT vehicle may be appropriately configured to accommodate any type of customized by those skilled in the art without undue experimentation.

According to one embodiment of the present disclosure, a system for a semiconductor fabrication facility is provided. The system includes a manufacturing tool including a load port, a maintenance tool over the manufacturing tool, a rectangular zone overlapping with the load port of the manufacturing tool, a plurality of first sensors, a transporting tool between the maintenance tool and the manufacturing tool from a side view, at least a second sensor, at least a third sensor, and a control unit. The maintenance tool includes a first track and at least one maintenance crane movable mounted on the first track. The plurality of first sensors are disposed on the first track and at corners of the rectangular zone. The first sensors are configured to detect a location of the maintenance crane and generate a first location data. The transporting tool includes a second track and at least one OHT vehicle movably mounted on the second track. The second sensor is disposed on the OHT vehicle and configured to generate a second location data of the OHT vehicle. The third sensor is disposed on the load port. The control unit is configured to receive the first location data of the maintenance crane and the second location data of the OHT vehicle, and send signals to the second sensor and the third sensor or to cut off the signal to the second sensor.

According to another embodiment, a method for operating a system for a semiconductor fabrication facility is provided. The method includes following operations. A manufacturing tool, a maintenance tool, a transporting tool and a control unit are provided. The manufacturing tool includes a load port. The maintenance tool includes a maintenance crane. The transporting tool includes an OHT vehicle. The control unit includes a data collector and an interface panel. A danger zone overlapping the load port of the manufacturing tool is defined. A location of the maintenance crane of the maintenance tool is detected and a first location data of the maintenance crane is generated. A location of the OHT vehicle is detected and a second location data of the OHT vehicle is generated. Switching, by the control unit, between a first mode when the second location data overlaps with the danger zone and a second mode when the first location data overlaps with the danger zone.

According to one embodiment of the present disclosure, a method for operating a system for a semiconductor fabrication facility is provided. The method includes following operations. A manufacturing tool, a maintenance tool, a transporting tool and a control unit are provided. The manufacturing tool includes a load port. The maintenance tool includes a maintenance crane. The transporting tool includes an OHT vehicle. A danger zone overlapping the load port is defined. A location of the maintenance crane of the maintenance tool is detected. A location of the OHT vehicle is detected. The maintenance crane is prohibited from entering the danger zone when the OHT vehicle enters the danger zone. The OHT vehicle is disabled when the maintenance crane enters the danger zone.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for a semiconductor fabrication facility, comprising:
   a manufacturing tool comprising a load port;
   a maintenance tool over the manufacturing tool, wherein the maintenance tool comprises a first track and at least one maintenance crane movably mounted on the first track;
   a rectangular zone overlapping with the load port of the manufacturing tool;
   a plurality of first sensors on the first track and at corners of the rectangular zone, wherein the first sensors are configured to detect a location of the maintenance crane and generate a first location data;
   a transporting tool between the maintenance tool and the manufacturing tool from a side view, wherein the transporting tool comprises a second track and at least one overhead hoisting transporting (OHT) vehicle movably mounted on the second track;
   at least one second sensor on the OHT vehicle configured to generate a second location data of the OHT vehicle;
   at least one third sensor on the load port; and
   a control unit configured to receive the first location data of the maintenance crane and the second location data of the OHT vehicle, and send signals to the second sensor and the third sensor or to cut off the signal to the second sensor.

2. The system of claim 1, wherein a width of the rectangular zone is greater than a width of the load port.

3. The system of claim 1, wherein the control unit comprises:
   a data collector configured to collect the first location data from the first sensors; and
   an interface panel configured to receive the first location data from the data collector and send signals to the second sensor and the third sensor or to cut off the signal to the second sensor.

4. The system of claim 1, wherein the second sensor and the third sensor perform a handshaking function to permit a load operation or an unload operation when the OHT vehicle enters the rectangular zone and aligns to the load port.

5. The system of claim 4, wherein the maintenance crane is prohibited from entering the rectangular zone when performing load operation or the unload operation.

6. The system of claim 1, wherein the control unit cuts off the signal to the second sensor when the maintenance crane enters the rectangular zone.

7. The system of claim 6, wherein when the signal to the second sensor is cut off, a handshaking function between the second sensor and the third sensor is interrupted, and a load operation or an unload operation is prohibited.

8. A method for operating a system for a semiconductor fabrication facility, comprising:
   providing a manufacturing tool comprising a load port, a maintenance tool comprising a maintenance crane, a transporting tool comprising an OHT vehicle and a control unit comprising a data collector and an interface panel;
   defining a danger zone overlapping the load port of the manufacturing tool;
   detecting a location of a maintenance crane of the maintenance tool and generating a first location data of the maintenance crane;
   detecting a location of the OHT vehicle and generating a second location data of the OHT vehicle; and
   switching, by the control unit, between a first mode when the second location data overlaps with the danger zone and a second mode when the first location data overlaps with the danger zone.

9. The method of claim 8, further comprising collecting the first location data by the data collector of the control unit.

10. The method of claim 8, further comprising switching between the first mode and the second mode by the interface panel of the control unit.

11. The method of claim 8, further comprising prohibiting the maintenance crane from entering the danger zone when the control unit switches to the first mode.

12. The method of claim 11, further comprising allowing the OHT vehicle aligning to the load port in the first mode.

13. The method of claim 12, further comprising sending signals to the second sensor and a third sensor on the load port in the first mode.

14. The method of claim 13, further comprising performing a handshaking function, by the second sensor and the third sensor, to permit a load operation or an unload operation when the OHT vehicle is aligned to the load port.

15. The method of claim 8, further comprising cutting off the signal to the second sensor to disable the OHT vehicle in the second mode.

16. The method of claim 15, further comprising interrupting a handshaking function between the second sensor and a third sensor on the load port to prohibit a load operation or an unload operation in the second mode.

* * * * *